US010020372B1

(12) United States Patent
Lim et al.

(10) Patent No.: US 10,020,372 B1
(45) Date of Patent: Jul. 10, 2018

(54) METHOD TO FORM THICKER ERASE GATE POLY SUPERFLASH NVM

(71) Applicant: GLOBALFOUNDRIES Singapore Pte. Ltd., Singapore (SG)

(72) Inventors: Khee Yong Lim, Singapore (SG); Kian Ming Tan, Singapore (SG); Fangxin Deng, Singapore (SG); Zhiqiang Teo, Singapore (SG); Xinshu Cai, Singapore (SG); Elgin Kiok Boone Quek, Singapore (SG); Fan Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/496,752

(22) Filed: Apr. 25, 2017

(51) Int. Cl.
*H01L 27/115* (2017.01)
*H01L 29/788* (2006.01)
*H01L 27/11573* (2017.01)
*H01L 21/28* (2006.01)
*H01L 29/51* (2006.01)
(Continued)

(52) U.S. Cl.
CPC .. *H01L 29/42328* (2013.01); *H01L 21/02236* (2013.01); *H01L 21/26513* (2013.01); *H01L 21/28273* (2013.01); *H01L 21/32136* (2013.01); *H01L 21/76816* (2013.01); *H01L 21/76895* (2013.01); *H01L 23/528* (2013.01); *H01L 23/535* (2013.01); *H01L 23/53271* (2013.01); *H01L 27/11521* (2013.01); *H01L 27/11526* (2013.01); *H01L 27/11548* (2013.01); *H01L 29/0649* (2013.01); *H01L 29/66825* (2013.01); *H01L 29/7883* (2013.01)

(58) Field of Classification Search
CPC ......... H01L 29/42328; H01L 21/26513; H01L 29/0649; H01L 23/53271; H01L 23/535; H01L 23/528; H01L 21/32136; H01L 21/02236; H01L 29/7883; H01L 21/28273; H01L 21/76895; H01L 21/76816; H01L 27/11526; H01L 27/11548; H01L 27/11521; H01L 29/66825
USPC .................................................. 257/315–325
See application file for complete search history.

(56) References Cited

U.S. PATENT DOCUMENTS 9,349,741 B2 * 5/2016 Liu .................. H01L 27/11524
2016/0181266 A1 * 6/2016 Chuang ............. H01L 27/11541
257/316

(Continued)

*Primary Examiner* — Marcos D Pizarro
*Assistant Examiner* — Nelson Garces
(74) *Attorney, Agent, or Firm* — Ditthavong & Steiner, P.C.

(57) ABSTRACT

A method of forming a thick EG polysilicon over the FG and resulting device are provided. Embodiments include forming a CG on a substrate; forming an STI between a logic region and the CG; forming a polysilicon EG through the CG and CG HM; forming a polysilicon structure over the logic and STI; forming and overfilling with polysilicon a WL trench through the CG and CG HM, between the EG and STI; forming a buffer oxide in the polysilicon structure over the logic region and part of the STI; recessing the buffer oxide and etching back the polysilicon overfill down the CG HM; forming a second buffer oxide over the EG and logic region; recessing the WL polysilicon; removing the first and second buffer oxides; forming a mask with an opening over a center of the WL, the STI, and a majority of the logic region; and removing exposed polysilicon.

14 Claims, 7 Drawing Sheets

(51) Int. Cl.
*H01L 29/423* (2006.01)
*H01L 29/66* (2006.01)
*H01L 27/11521* (2017.01)
*H01L 27/11548* (2017.01)
*H01L 27/11526* (2017.01)
*H01L 21/768* (2006.01)
*H01L 21/265* (2006.01)
*H01L 21/02* (2006.01)
*H01L 21/3213* (2006.01)
*H01L 23/528* (2006.01)
*H01L 23/535* (2006.01)
*H01L 23/532* (2006.01)
*H01L 29/06* (2006.01)

(56) References Cited

U.S. PATENT DOCUMENTS

2017/0125429 A1\* 5/2017 Su ..................... H01L 21/28273
2017/0345841 A1\* 11/2017 Wu ................... H01L 27/11573

\* cited by examiner

METHOD TO FORM THICKER ERASE GATE POLY SUPERFLASH NVM

TECHNICAL FIELD

The present disclosure relates to flash memory devices. The present disclosure is particularly applicable to flash memory devices for the 40 nanometer (nm) technologies node and beyond.

BACKGROUND

The embedded third generation SuperFlash® (ESF3) non-volatile memory (NVM) gate stack is two to three times taller compared to the logic gate (LG), making it challenging to share the cell word line (WL)/erase gate (EG) polysilicon (poly) with the high-voltage/low-voltage (HV/LV) logic polysilicon. In particular, for advanced scaled poly thickness logic processes, such as the 40 nm node, there is much less margin tolerance due to the above high aspect ratio delta. A known approach uses expensive double PC masks and reactive ion etching (RIE) for achieving the advanced embedded ESF3 process. Without the double PC mask to ensure sufficient PC RIE margins for both cell and logic poly, additional polysilicon etch back is required, causing thinner EG poly above the floating gate (FG) tip region. The thinned EG poly often result in close proximity of silicide and implant damages to the tunneling oxide region, thereby causing endurance and erase performance degradation.

A need therefore exists for methodology enabling thicker EG polysilicon over the FG tip region without requiring double PC masks or additional etch back of the EG poly.

SUMMARY

An aspect of the present disclosure is a method of forming a uniform and thick EG polysilicon over the FG tip region.

Another aspect of the present disclosure is a memory device with a uniform and thick EG polysilicon over the FG tip region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a control gate (CG) and a CG hardmask (HM) on a substrate; forming a shallow trench isolation (STI) region between a logic region and the CG; forming a polysilicon EG through the CG and CG HM; forming a polysilicon structure over the logic and STI regions; forming and overfilling with polysilicon a WL trench through the CG and CG HM, between the EG and the STI region; forming a first buffer oxide in the polysilicon structure over the logic region and part of the STI region; recessing the first buffer oxide and etching back the polysilicon overfill down the CG HM; forming a mask or second buffer oxide over the EG and logic region; recessing the WL polysilicon; removing the mask or second buffer oxide and the first buffer oxide; forming a mask with an opening over a center of the WL, the STI region, and a majority of the logic region; and removing exposed polysilicon.

Aspects of the present disclosure include forming a FG and an interpoly dielectric (IPD) on the substrate prior to forming the CG and CG HM, wherein the FG and CG includes polysilicon, the IPD includes an oxide/nitride/oxide stack, and the CG HM includes a nitride/oxide/nitride stack. Further aspects include forming the IPD of an oxide/nitride/oxide stack, and forming the CG HM of a nitride/oxide/nitride stack. Another aspect includes forming the EG by forming a source region in the substrate by an N-type dopant implant; oxidizing an upper portion of the source region; forming nitride and oxide spacers on sidewalls of a trench; and filling the trench with polysilicon. Further aspects include forming nitride and oxide spacers on sidewalls of the WL trench prior to overfilling with polysilicon. Additional aspects include forming the first buffer oxide to a thickness of 500 angstroms (Å) to 2000 Å. Other aspects include recessing the first buffer oxide by 250 Å to 1050 Å. Additional aspects include recessing the WL polysilicon by 1200 Å to 1700 Å. Further aspects include removing exposed polysilicon in the WL trench by RIE. Other aspects include performing RIE in the WL. Additional aspects include forming the mask over the logic region covering a portion of the polysilicon.

Another aspect of the present disclosure is a device including: a FG, an IPD, a CG and a CG HM stack on a substrate; an STI region between the stack and a logic region; an EG and a recessed WL having a space in the middle, each surrounded by the stack, and an LG in the logic region having a height less than a height of the EG; a source region in the Si substrate under the EG; and a silicon oxide over the source region.

Aspects of the device include the FG and CG including polysilicon; the IPD including an oxide/nitride/oxide stack; and the CG HM including a nitride/oxide/nitride stack. Another aspect includes the EG polysilicon having a thickness of 800 Å to 1600 Å and is thicker than WL polysilicon. A further aspect includes the WL polysilicon having a thickness of 600 Å to 1000 Å. Other aspects include the WL polysilicon layer recessed by 1200 Å to 1700 Å. A further aspect includes the space in the WL having a width equal to an opening in a mask over the WL.

A further aspect of the present disclosure is a method including: forming a FG of polysilicon and IPD of an oxide/nitride/oxide stack on a substrate; forming a CG of polysilicon and a CG HM of nitride/oxide/nitride stack on the substrate; forming an STI region between a logic region and the CG; forming a polysilicon EG through the CG and CG HM; forming a polysilicon structure over the logic and STI regions; forming and overfilling with polysilicon a WL trench through the CG and CG HM, between the EG and the STI region; forming a first buffer oxide to a thickness of 500 Å to 2000 Å in the polysilicon structure over the logic region and part of the STI region; recessing the first buffer oxide by 250 Å to 1050 Å and etching back the polysilicon overfill down the CG HM; forming a mask or second buffer oxide over the EG and logic region; recessing the WL polysilicon to 1200 Å to 1700 Å; removing the mask or second buffer oxide and the first buffer oxide; forming a mask with an opening over a center of the WL, the STI region, and a majority of the logic region; and removing exposed polysilicon by RIE.

Aspects of the present disclosure include forming the EG by forming a source region in the substrate by an N-type dopant implant; oxidizing an upper portion of the source region; forming nitride and oxide spacers on sidewalls of a trench; and filling the trench with polysilicon. Another aspect includes forming nitride and oxide spacers on sidewalls of the WL trench prior to overfilling with polysilicon.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
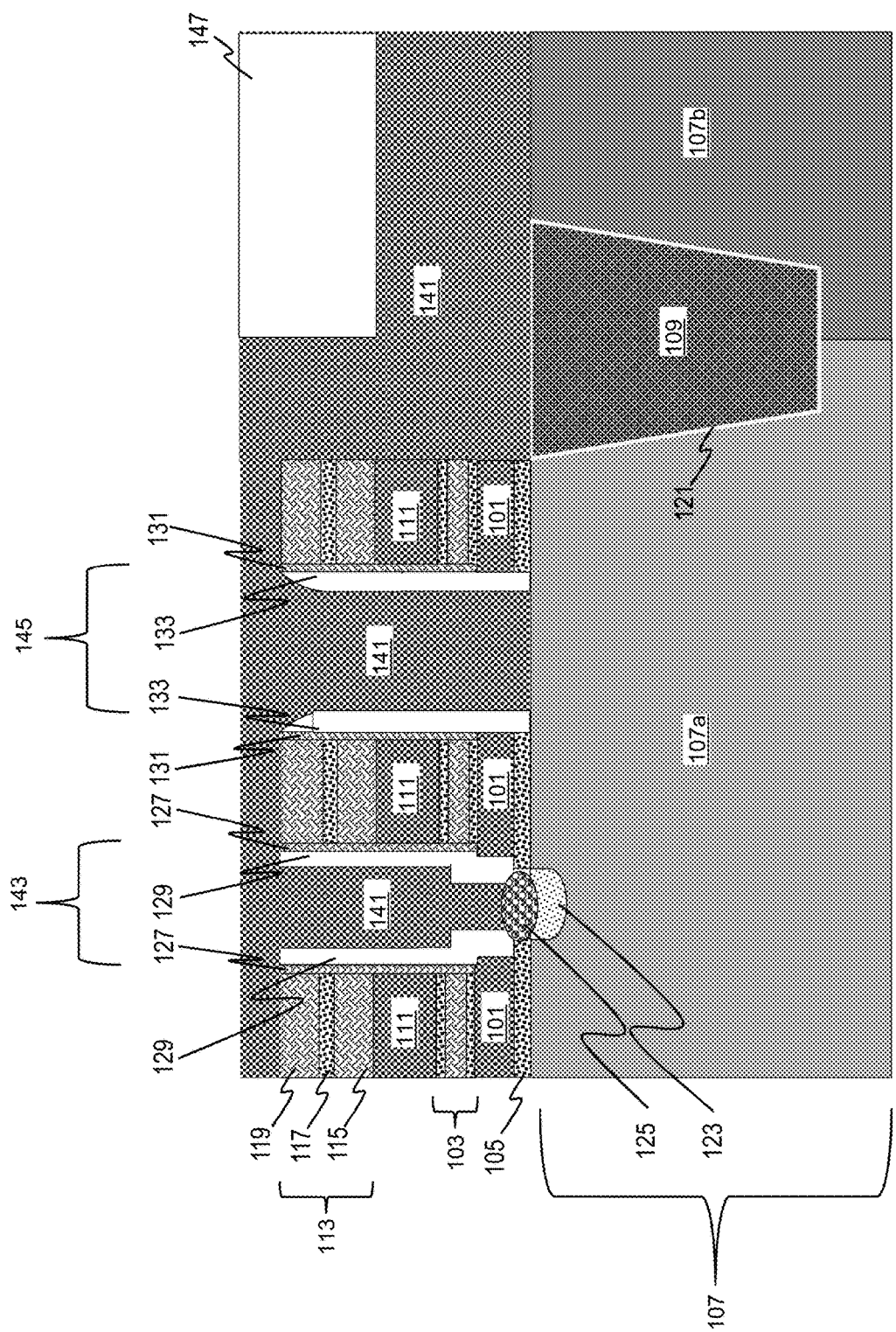
FIGS. 1 through 7 schematically illustrate a process flow for forming a thick EG poly over the FG tip region by applying a single PC mask to block the EG region during the WL polysilicon etch back processing step, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a thin EG polysilicon layer above the FG tip region attendant upon forming an embedded ESF3 SuperFlash memory cell. The problem is solved, inter alia, by forming a thick EG polysilicon layer above the FG tip region using a single PC mask to block the EG region during the WL polysilicon etch back processing step.

Methodology in accordance with embodiments of the present disclosure includes forming a CG and a CG HM on a substrate. An STI region is formed between a logic region and the CG, and a polysilicon EG is formed through the CG and CG HM. A polysilicon structure is formed over the logic and STI regions. A WL trench is formed and overfilled with polysilicon through the CG and CG HM, between the EG and the STI region. Then, a first buffer oxide is formed in the polysilicon structure over the logic region and part of the STI region followed by recessing the first buffer oxide and etching back the polysilicon overfill down the CG HM. Thereafter, a mask or second buffer oxide is formed over the EG and logic region. Next, the WL polysilicon is recessed. Then, the mask or second buffer oxide and the first buffer oxide are removed. Next, a mask is formed with an opening over a center of the WL, the STI region, and a majority of the logic region. Then, the exposed polysilicon is removed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 7 schematically illustrate a process flow for forming a thick EG poly over the FG tip region by applying a mask to block the EG region during the WL polysilicon etch back processing step, in accordance with an exemplary embodiment. Adverting to FIG. 1, a FG 101 and an IPD 103 are formed on an oxide layer 105 over a Si substrate 107 that includes a memory region 107a and a logic region 107b separated by an STI region 109 including an oxide layer 121. The FG 101 may be formed, e.g., of polysilicon to a thickness of 250 Å to 500 Å, and the IPD 103 may be formed, e.g., of an oxide/nitride/oxide stack, each layer having a thickness, e.g., of 35 Å to 70 Å. Then, a CG 111, e.g., formed of polysilicon to a thickness of 400 Å to 800 Å, and a CG HM 113 are consecutively formed over the Si substrate 107. The CG HM 113 may be formed, e.g., of a nitride layer 115, an oxide layer 117, and nitride layer 119 stack, the nitride layers 115 and 119 being formed to a thickness, e.g., of 400 Å to 600 Å, and the oxide layer 117 being formed to a thickness, e.g., of 0 Å to 200 Å.

Next, a series of trenches (not shown for illustrative convenience) are formed through the CG 111 and CG HM 113, the FG 101 and IPD 103, and the oxide layer 105 down to the Si substrate 107. A source region 123 is formed in the Si substrate 107, e.g., by an N-type dopant implant. The upper portion 125 of the source region 123 is then oxidized resulting in silicon oxide. The growth of the silicon oxide is accelerated due to the high N-type dopant implant. Next, nitride spacers 127 and oxide spacers 129 are respectively formed on the sidewalls of one of the trenches and nitride spacers 131 and oxide spacers 133, respectively are formed on sidewalls of an adjacent trench. The nitride spacers 127 are each formed, e.g., to a thickness of 75 Å to 200 Å, and the oxide spacers 129 are each formed, e.g., to a thickness of 50 Å to 150 Å. The nitride spacers 131 are each formed, e.g., to a thickness of 75 Å to 200 Å, and the oxide spacers 133 are each formed, e.g., to a thickness of 100 Å to 350 Å. Thereafter, the trenches are filled with polysilicon layer 141, forming the polysilicon EG 143, e.g., having a thickness of 800 Å to 1600 Å and is thicker than WL polysilicon, and the WL polysilicon 145, e.g., having a thickness of 600 Å to 1000 Å. A buffer oxide layer 147 is formed, e.g., to a thickness of 500 Å to 2000 Å in the polysilicon layer 141 over the logic region 107b and part of the STI region 109.

Figure 2:
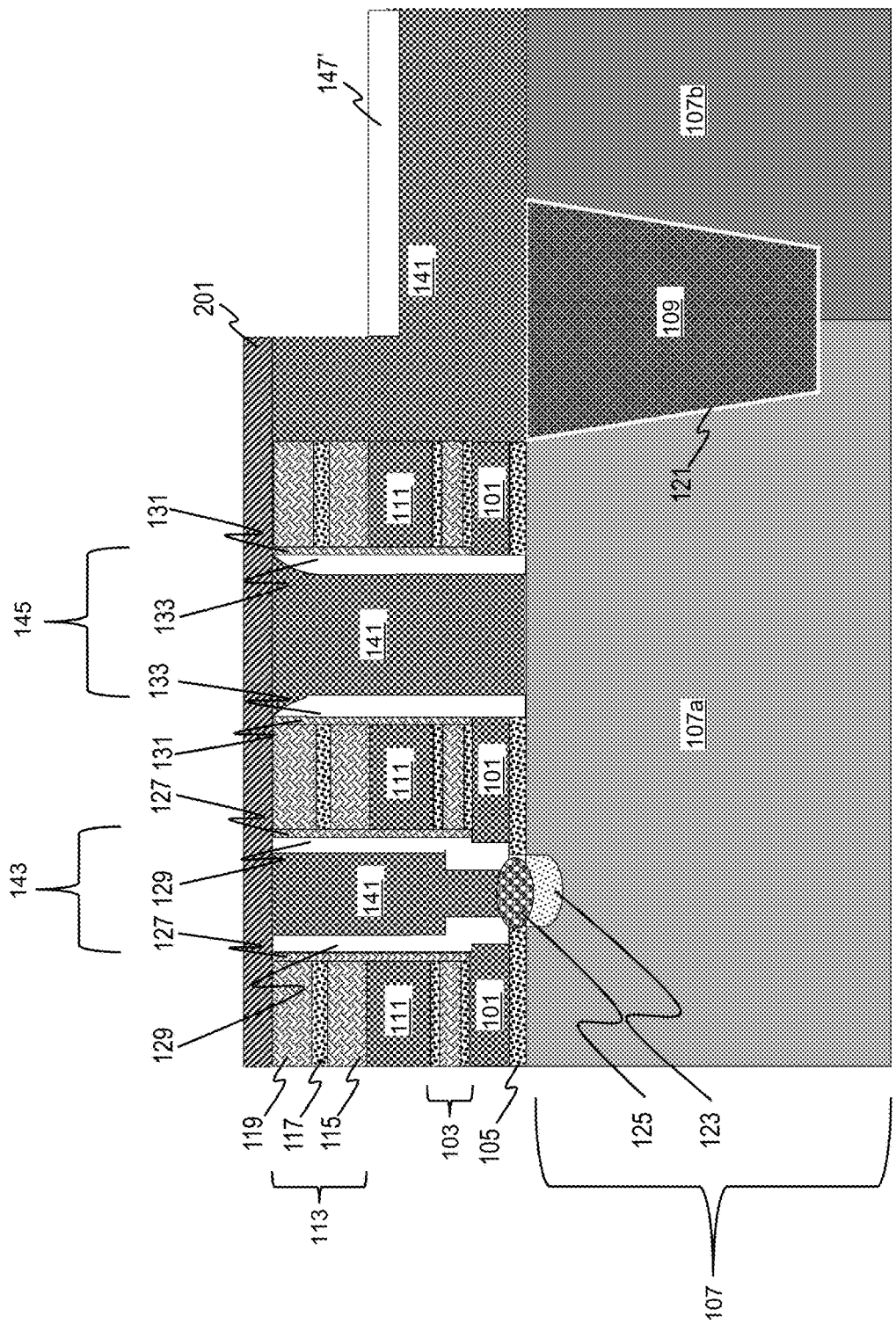
Figure 3:
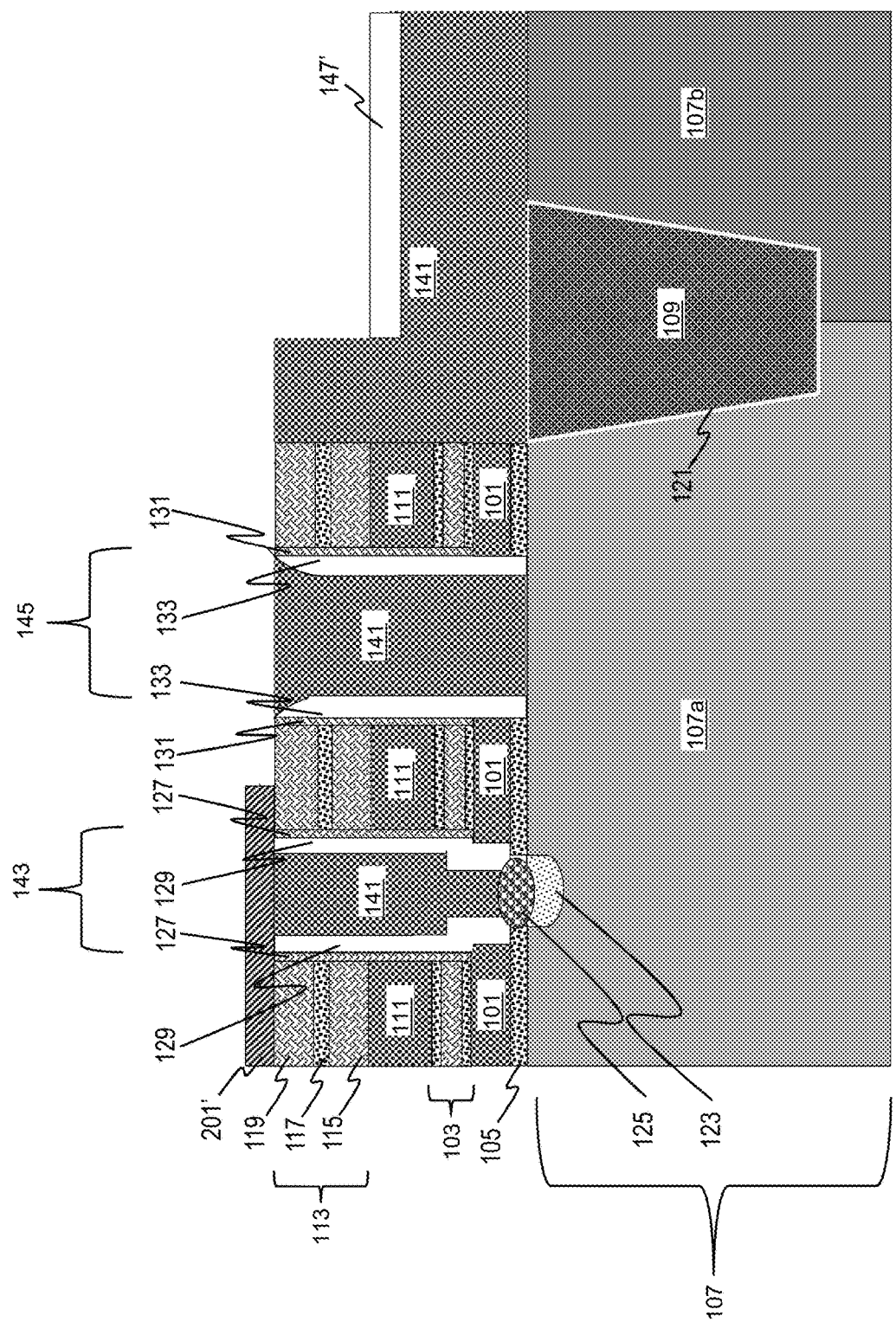
Figure 4:
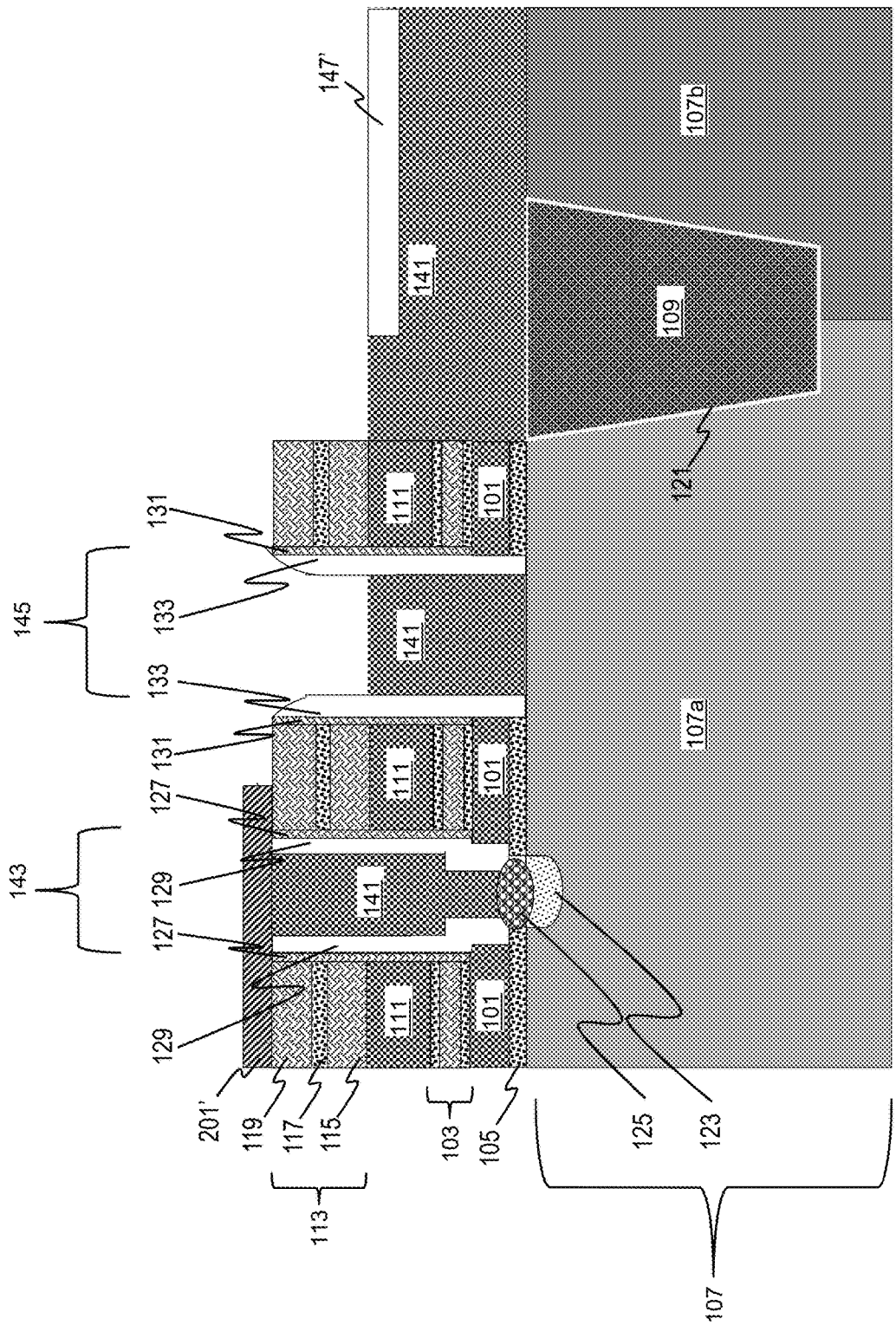
Figure 5:
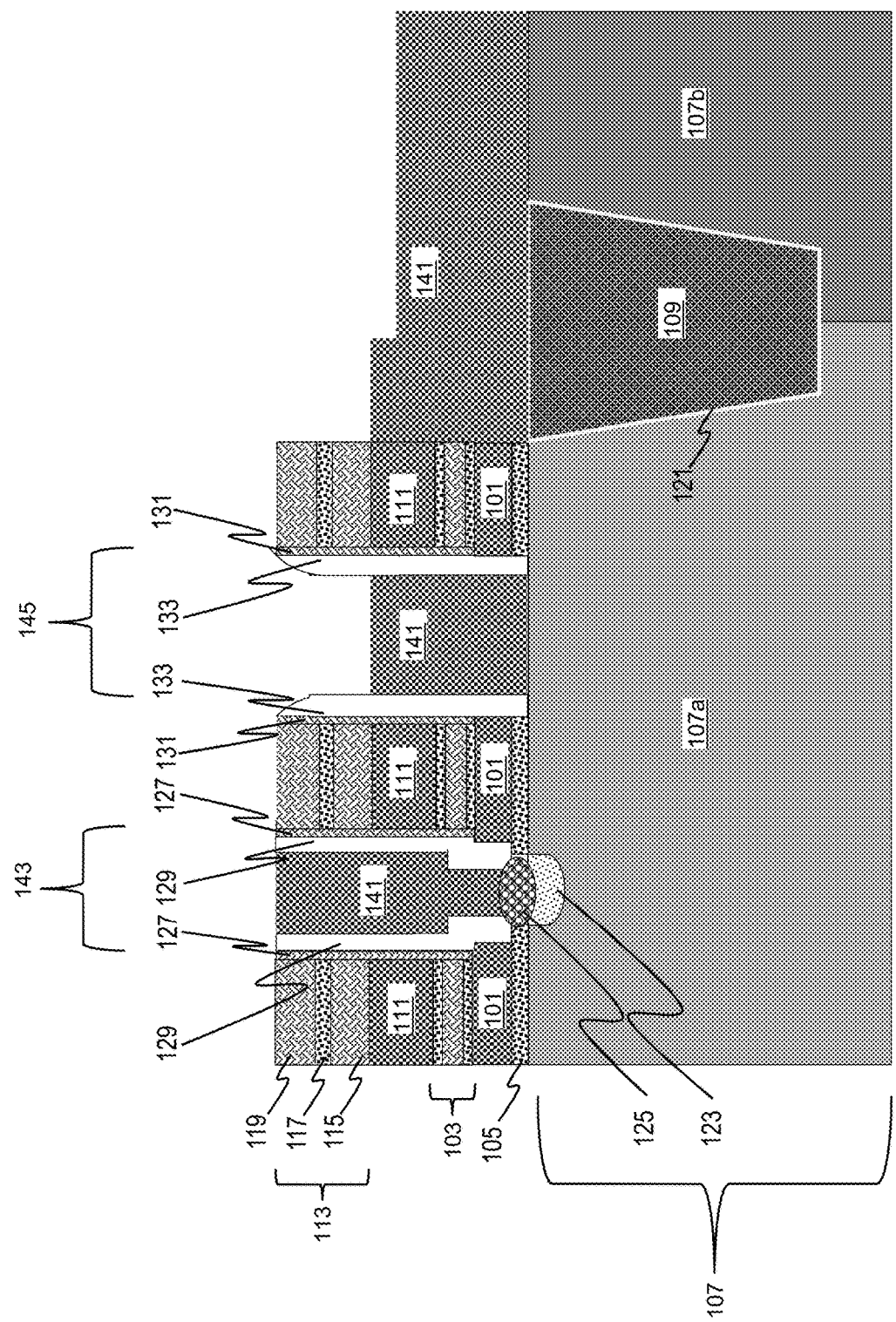

As illustrated in FIG. 2, the buffer oxide layer 147 is recessed, e.g., by 250 Å to 1050 Å by diluted hydrofluoric acid (DHF), forming buffer oxide layer 147' and the polysilicon layer 141 is etched back stopping on the nitride layer 119 the CG HM 113. Then, a photoresist or buffer oxide layer 201 is formed, e.g., to a thickness of 400 Å to 600 Å if a buffer oxide is used, over the EG 143, the WL 145, and a portion of the STI region 109 up to the buffer oxide layer 147'. Adverting to FIG. 3, a portion of the photoresist or buffer oxide layer 201 is removed from over the WL 145, forming the photoresist or buffer oxide layer 201'. Next, in FIG. 4, the exposed polysilicon 141 is recessed, e.g., by 1200 Å to 1700 Å, down to the buffer oxide layer 147', forming polysilicon 141'. The recessing of the polysilicon layer 141 reduces the polysilicon aspect ratio delta in the WL 145 and over the logic region 107b without reducing the depth of the polysilicon layer 141 of the EG 143. Thereafter, the photoresist or buffer oxide layer 201' and the buffer oxide layer 147' are removed, as illustrated in FIG. 5.

Figure 6:
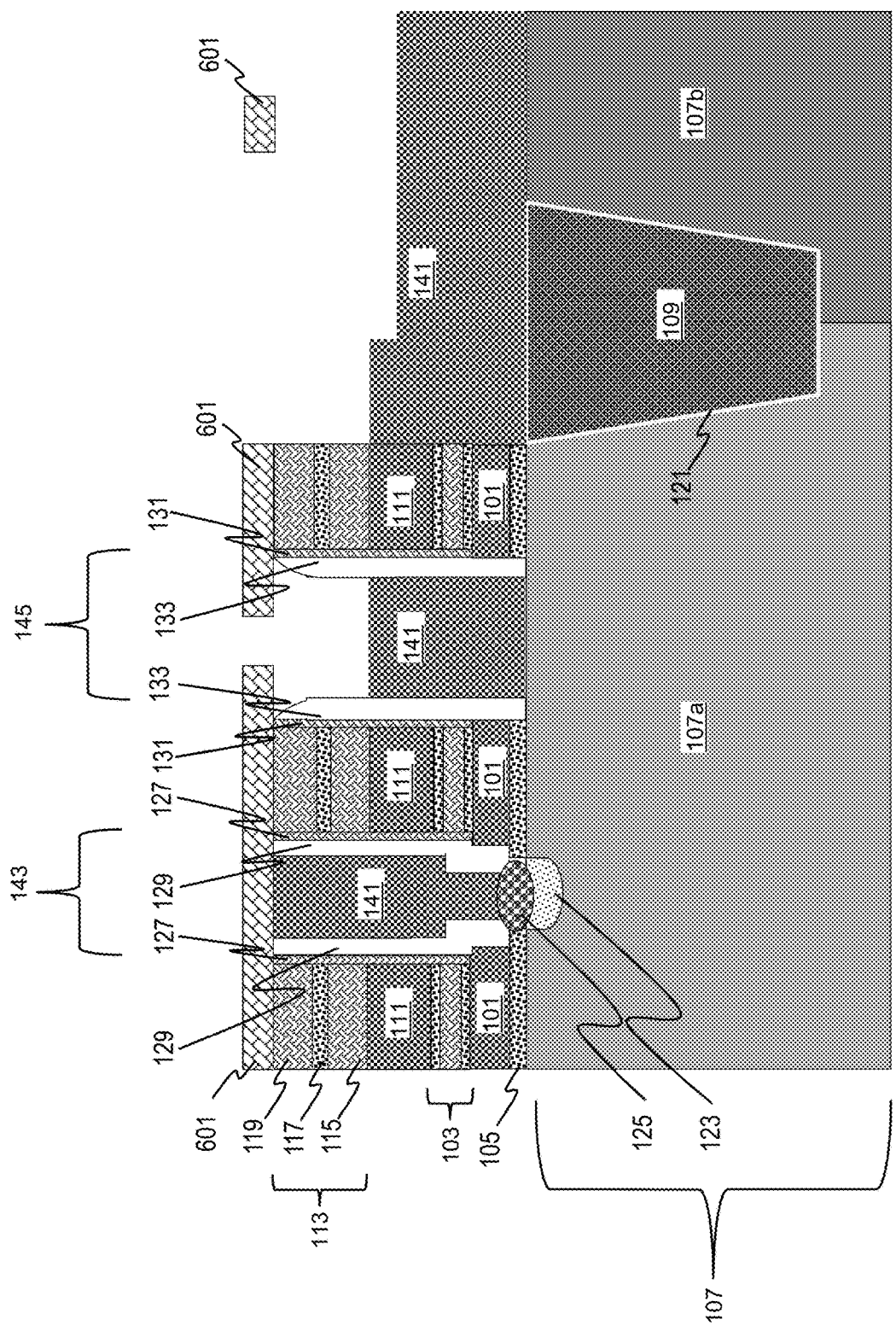
Figure 7:
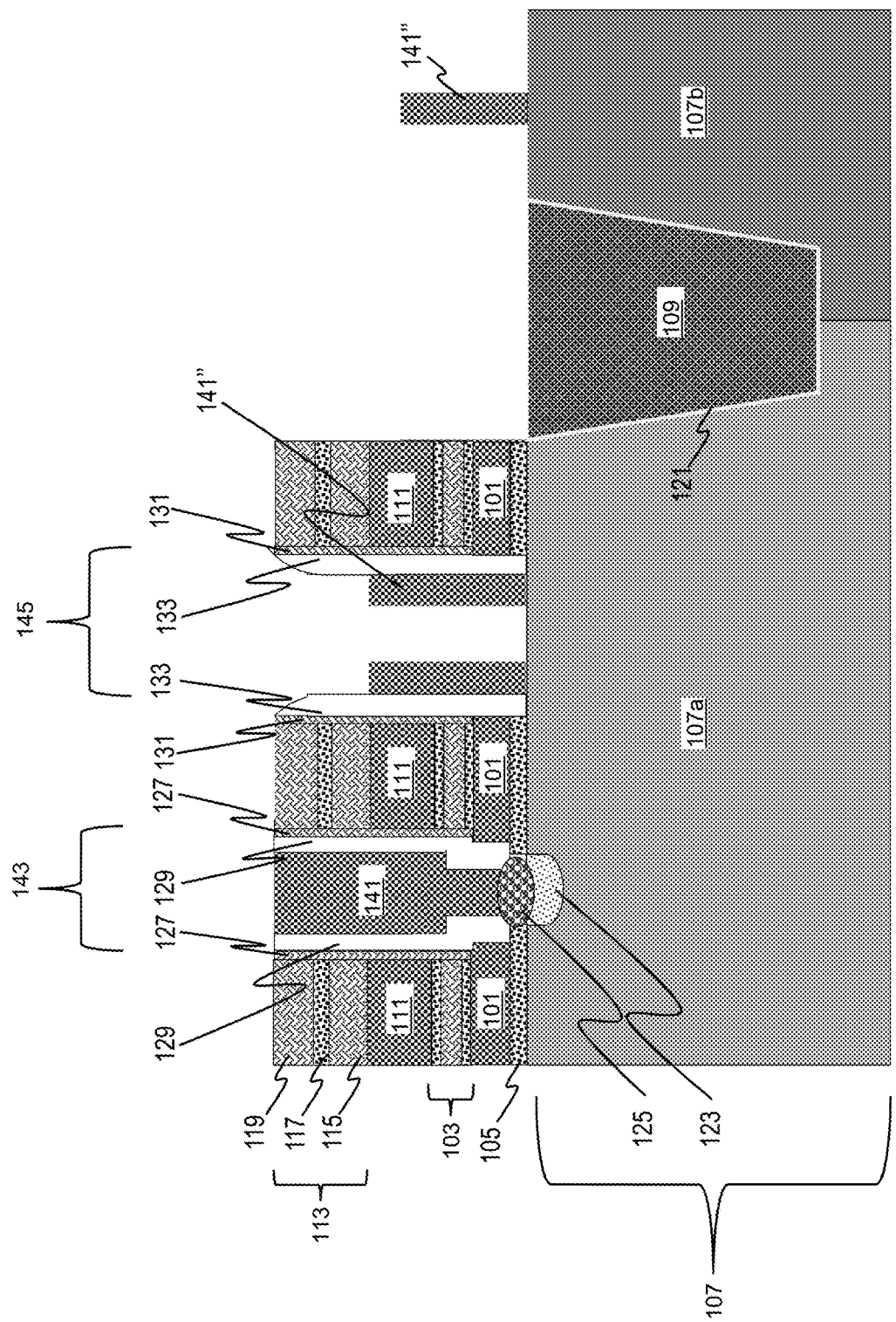

Adverting to FIG. 6, a mask 601 is formed over the memory region 107a and a portion of the logic region 107b, with an opening over a center of the WL 145 and a majority of the logic region 107b uncovered. Then, in FIG. 7, the exposed polysilicon 141' in the WL 145 and over the STI region 109 and logic region 107b are removed, e.g., by RIE, to avoid WL to WL polysilicon residue, thereby forming the polysilicon layer 141". The space between the polysilicon layer 141" may have a width that is equal to an opening in the mask 601 over a center of the WL 145, e.g., 1000 Å to 3000 Å. Subsequently, the mask 601 is removed. The result is that the EG 143 has a distinctly taller and thicker polysilicon layer 141.

The embodiments of the present disclosure can achieve several technical effects, such as avoiding the cost and complexity of the known double PC patterning and RIE scheme, preventing silicide/EG implant damage to key erase tunneling region of FG tip, and improving cell endurance and erase performance, poly uniformity control, and cell EG related terminal isolation breakdown voltages (BVs). Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices including flash memory devices for the 40 nm technologies node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a control gate (CG) and a CG hardmask (HM) on a substrate;
   forming a shallow trench isolation (STI) region between a logic region and the CG;
   forming a polysilicon erase gate (EG) through the CG and CG HM;
   forming a polysilicon structure over the logic and STI regions;
   forming and overfilling with polysilicon a word line (WL) trench through the CG and CG HM, between the EG and the STI region;
   forming a first buffer oxide in the polysilicon structure over the logic region and part of the STI region;
   recessing the first buffer oxide and etching back the polysilicon overfill down the CG HM;
   forming a mask or second buffer oxide over the EG and logic region;
   recessing the WL polysilicon;
   removing the mask or second buffer oxide and the first buffer oxide;
   forming a mask with an opening over a center of the WL, the STI region, and a majority of the logic region; and
   removing exposed polysilicon.

2. A method according to claim 1, further comprising:
   forming a floating gate (FG) and interpoly dielectric (IPD) on the substrate prior to forming the CG and CG HM, wherein the FG and CG comprise polysilicon, the IPD comprises an oxide/nitride/oxide stack, and the CG HM comprises a nitride/oxide/nitride stack.

3. A method according to claim 2, comprising forming the IPD of an oxide/nitride/oxide stack, and forming the CG HM of a nitride/oxide/nitride stack.

4. A method according to claim 1, comprising forming the EG by:
   forming a source region in the substrate by an N-type dopant implant;
   oxidizing an upper portion of the source region;
   forming nitride and oxide spacers on sidewalls of a trench; and
   filling the trench with polysilicon.

5. A method according to claim 1, further comprising forming nitride and oxide spacers on sidewalls of the WL trench prior to overfilling with polysilicon.

6. A method according to claim 1, comprising:
   forming the first buffer oxide to a thickness of 500 angstroms (Å) to 2000 Å.

7. A method according to claim 1, comprising:
   recessing the first buffer oxide by 250 Å to 1050 Å.

8. A method according to claim 1, comprising recessing the WL polysilicon by 1200 Å to 1700 Å.

9. A method according to claim 1, comprising removing exposed polysilicon in the WL trench by reactive ion etching (RIE).

10. A method according to claim 9, comprising performing RIE in the WL trench.

11. A method according to claim 1, comprising forming the mask over the logic region covering a portion of the polysilicon.

12. A method comprising:
    forming a floating gate (FG) of polysilicon and interpoly dielectric (IPD) of an oxide/nitride/oxide stack on a substrate;
    forming a control gate (CG) of polysilicon and a CG HM of nitride/oxide/nitride stack on the substrate;
    forming a shallow trench isolation (STI) region between a logic region and the CG;
    forming a polysilicon erase gate (EG) through the CG and CG HM;
    forming a polysilicon structure over the logic and STI regions;
    forming and overfilling with polysilicon a word line (WL) trench through the CG and CG HM, between the EG and the STI region;
    forming a first buffer oxide to a thickness of 500 to 2000 angstroms (Å) in the polysilicon structure over the logic region and part of the STI region;
    recessing the first buffer oxide by 250 to 1050 Å and etching back the polysilicon overfill down the CG HM;
    forming a mask or second buffer oxide over the EG and logic region;
    recessing the WL polysilicon to 1200 Å to 1700 Å;
    removing the mask or second buffer oxide and the first buffer oxide;
    forming a mask with an opening over a center of the WL, the STI region, and a majority of the logic region; and
    removing exposed polysilicon by reactive ion etching (RIE).

13. A method according to claim 12, comprising forming the EG by:
- forming a source region in the substrate by an N-type dopant implant;
- oxidizing an upper portion of the source region;
- forming nitride and oxide spacers on sidewalls of a trench; and
- filling the trench with polysilicon.

14. A method according to claim 12, comprising forming nitride and oxide spacers on sidewalls of the WL trench prior to overfilling with polysilicon.

* * * * *